(12) United States Patent
Saito

(10) Patent No.: US 8,587,364 B2
(45) Date of Patent: Nov. 19, 2013

(54) RECEIVING CIRCUIT HAVING A LIGHT RECEIVING ELEMENT WHICH RECEIVES A LIGHT SIGNAL

(75) Inventor: Hisami Saito, Fukuoka-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/421,804

(22) Filed: Mar. 15, 2012

(65) Prior Publication Data

US 2012/0274365 A1 Nov. 1, 2012

(30) Foreign Application Priority Data

Apr. 26, 2011 (JP) ................................. P2011-097824

(51) Int. Cl.
*H01L 31/00* (2006.01)
(52) U.S. Cl.
USPC .................. 327/514; 250/214 A; 398/202
(58) Field of Classification Search
None
See application file for complete search history.

(56) References Cited

U.S. PATENT DOCUMENTS

| | | | | |
|---|---|---|---|---|
| 5,307,196 A * | 4/1994 | Kinoshita | ................... | 398/202 |
| 5,981,936 A * | 11/1999 | Fujiie | ................... | 250/214 A |
| 6,201,235 B1 * | 3/2001 | Takeuchi et al. | ....... | 250/214 AG |
| 6,838,654 B2 * | 1/2005 | Kuo et al. | ................... | 250/214 A |
| 6,841,771 B2 * | 1/2005 | Shimizu | ................... | 250/214 A |
| 6,885,249 B2 | 4/2005 | Suzunaga | | |
| 7,421,213 B2 * | 9/2008 | Harms et al. | ................... | 398/210 |
| 7,476,890 B2 * | 1/2009 | Kishi | ................... | 250/551 |
| 7,635,837 B2 * | 12/2009 | Uo et al. | ................... | 250/214 A |
| 7,787,780 B2 * | 8/2010 | Suzunaga | ................... | 398/210 |
| 2002/0175272 A1 * | 11/2002 | Shimizu | ................... | 250/214 A |
| 2008/0308715 A1 * | 12/2008 | Sakura | ................... | 250/214 A |
| 2010/0172656 A1 | 7/2010 | Saitou et al. | | |

FOREIGN PATENT DOCUMENTS

| | | |
|---|---|---|
| JP | 3665635 | 4/2005 |
| JP | 2004-179982 | 6/2010 |
| JP | 4568205 | 8/2010 |

* cited by examiner

*Primary Examiner* — Tuan T Lam
(74) *Attorney, Agent, or Firm* — Patterson & Sheridan, LLP

(57) ABSTRACT

According to one embodiment, a receiving circuit is provided. The receiving circuit has a first light receiving element, a signal voltage generator, a second light receiving element, a delay element and a comparator. The first light receiving element receives a light signal and converts the light signal into a first current. The signal voltage generator converts the first current into a signal voltage. The second light receiving element receives the light signal and converts the light signal into a second current. The reference voltage generator converts the second current into a voltage and outputs the voltage as a reference voltage. The delay element delays and reduces a signal component of the reference voltage. The comparator compares the signal voltage from the signal voltage generator with a threshold voltage based on an output voltage of the delay element.

10 Claims, 7 Drawing Sheets

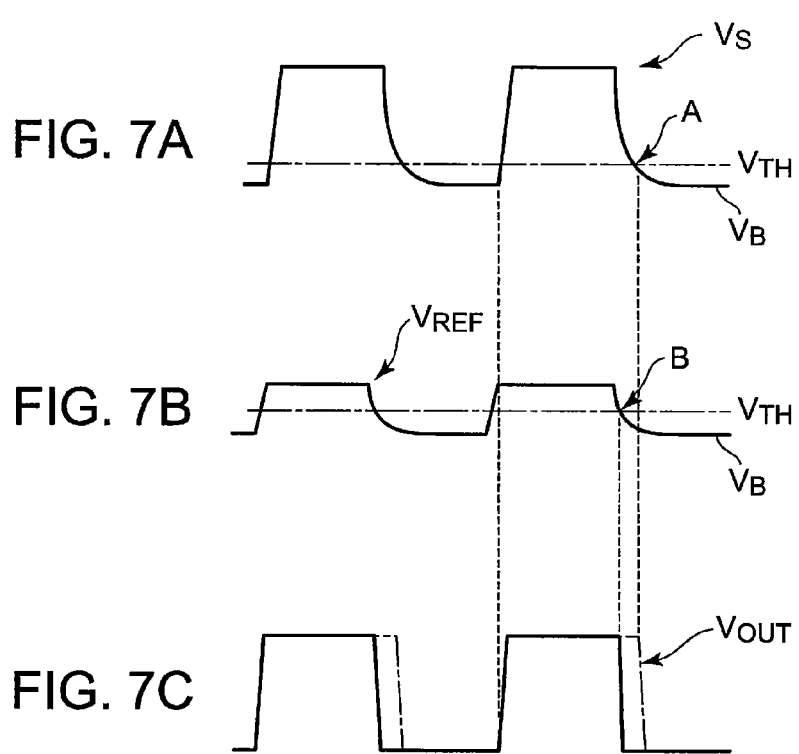

US 8,587,364 B2

RECEIVING CIRCUIT HAVING A LIGHT RECEIVING ELEMENT WHICH RECEIVES A LIGHT SIGNAL

CROSS-REFERENCE TO RELATED APPLICATION(S)

This application is based upon and claims the benefit of priority from the prior Japanese Patent Application No. 2011-97824, filed on Apr. 26, 2011, the entire contents of which are incorporated herein by reference.

FIELD

Embodiments described herein relate generally to a receiving circuit having a light receiving element which receives a light signal.

BACKGROUND

An optical coupling device which transmits a signal through transmission/reception of light is provided with a receiving circuit. The receiving circuit needs to prevent erroneous operation. The receiving circuit receives a light signal by a photodiode (PD). The photodiode converts the light signal into a photocurrent. Further, the receiving circuit converts the photocurrent into a signal voltage. The receiving circuit is provided with a comparator circuit to compare the level of the signal voltage and a threshold value so as to generate an output signal.

The level of the signal voltage changes depending on intensity of the light signal which is input into the photodiode. The luminous efficiency of a light emitting diode (LED) which is provided on a transmitting side fluctuates largely depending on temperature, and the level of the light signal changes considerably in accordance with change of an ambient temperature. As a result, the comparator may operate erroneously so that a correct signal cannot be output.

In order to prevent such an erroneous operation, a system of detecting a peak of a signal level of a signal voltage can be used so that a threshold level may follow the signal level. However, even such a system may cause an erroneous operation, due to an overshoot of a signal waveform of the signal voltage or a tailing phenomenon in which a falling portion of a signal waveform output from a photodiode is stretched. Accordingly, the receiving circuit is required to suppress erroneous operation resulting from fluctuation of a light signal.

BRIEF DESCRIPTION OF THE DRAWINGS

FIGS. 7A to 7C are time charts showing an operation of a receiving circuit according to a comparative example.

DETAILED DESCRIPTION

Figures 1A, 1B:
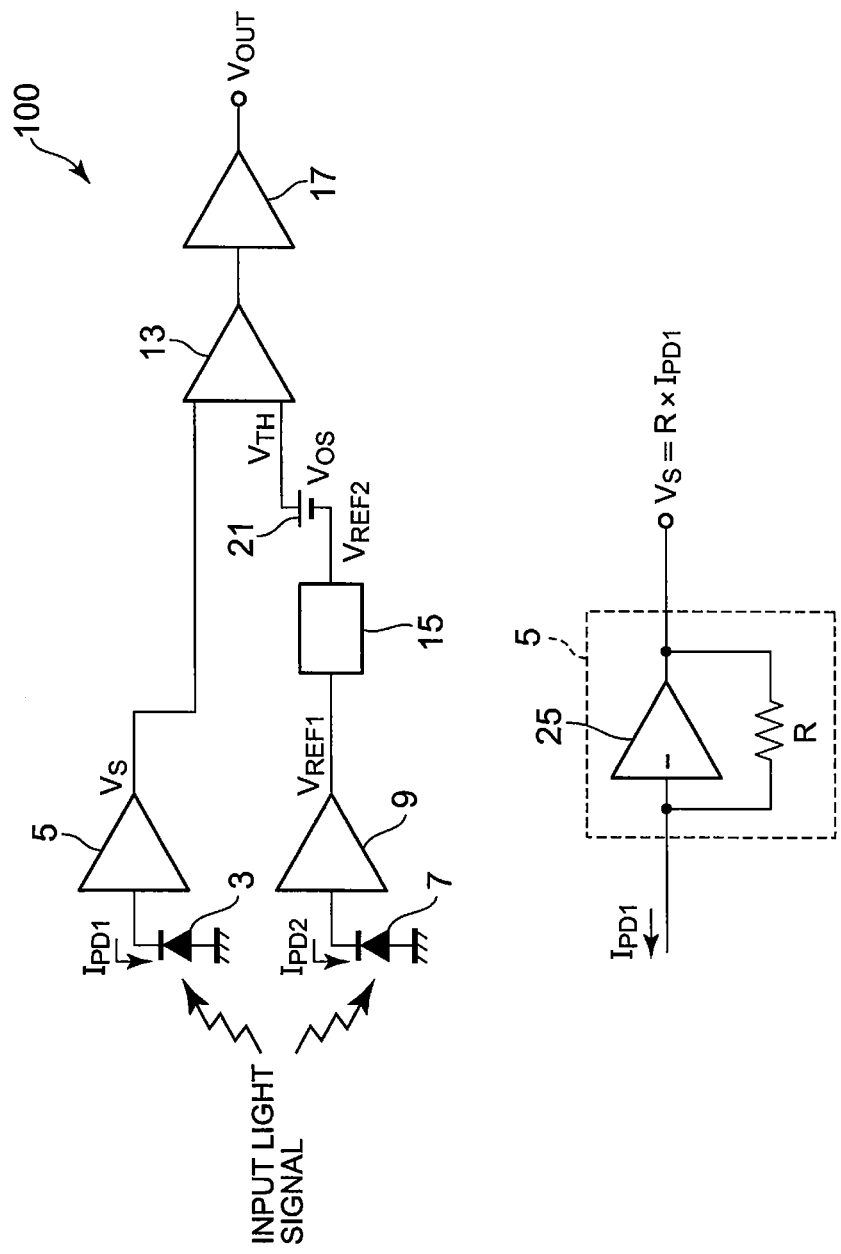
FIG. 1A is a circuit diagram showing a receiving circuit according to a first embodiment.
FIG. 1B is a circuit diagram showing a signal voltage generator.

According to one embodiment, a receiving circuit is provided. The receiving circuit has a first light receiving element, a signal voltage generator, a second light receiving element, a delay element and a comparator.

The first light receiving element receives a light signal and converts the light signal into a first current. The signal voltage generator converts the first current into a signal voltage. The second light receiving element receives the light signal and converts the light signal into a second current. The reference voltage generator converts the second current into a voltage and outputs the voltage as a reference voltage. The delay element delays and reduces a signal component of the reference voltage. The comparator compares the signal voltage from the signal voltage generator with a threshold voltage based on an output voltage of the delay element.

Hereinafter, further embodiments will be described with reference to the drawings.

In the drawings, the same reference numerals denote the same or similar portions respectively.

FIGS. 1A and 1B are circuit diagrams showing a receiving circuit according to a first embodiment.

The receiving circuit is a receiving unit of a photo-coupler, for example.

As shown in FIG. 1A, a receiving circuit 100 is provided with a photodiode 3 which is a first light receiving element to receive a light signal, and a photodiode 7 which is a second light receiving element.

The photodiode 3 is connected to an input terminal of a signal voltage generator 5. The photodiode 3 converts a light signal into a first photocurrent $I_{PD1}$. The photocurrent $I_{PD1}$ is converted into a signal voltage $V_S$ by the signal voltage generator 5.

On the other hand, the photodiode 7 is connected to the input terminal of a reference voltage generator 9 and converts a light signal into a second photocurrent $I_{PD2}$. The reference voltage generator 9 converts the photocurrent $I_{PD2}$ into a first reference voltage $V_{REF1}$ and outputs the reference voltage $V_{REF1}$.

The first reference voltage $V_{REF1}$ which is output from the reference voltage generator 9 is input into a delay circuit 15, which is a delay element. A second reference voltage $V_{REF2}$ which is obtained by reducing a signal component of the first reference voltage $V_{REF1}$ and delaying the voltage by a predetermined time period is output from the delay circuit 15. A threshold voltage $V_{TH}$ obtained by adding an offset voltage $V_{OS}$ to the second reference voltage $V_{REF2}$ is input into a comparator 13 which is a comparison unit.

The comparator 13 compares the signal voltage $V_S$ and the threshold voltage $V_{TH}$ and outputs a pulse signal in accordance with a relation between levels of both of the voltages. An output $V_{OUT}$ of the comparator 13 is output to an external circuit (not shown) via an output circuit 17.

A low-pass filter can be used, for example, as the delay circuit 15. The offset voltage $V_{OS}$ is added by a constant voltage circuit 21 which is provided between an output terminal of the delay circuit 15 and an input terminal of the comparator 13. A CMOS inverter can be used, for example, as the output circuit 17.

FIG. 1B is a circuit diagram showing an example of the signal voltage generator 5. The signal voltage generator 5 is a trans-impedance amplifier (TIA), for example, and contains an inverter amplifier 25 and a feedback resistor R which gives feedback of the output of the inverter amplifier 25 to an input side of the inverter amplifier 25. The signal voltage generator 5 converts the photocurrent $I_{PD1}$ of the photodiode 3 into the signal voltage $V_S$ which is expressed by the following formula (1), and outputs the signal voltage $V_S$.

$$V_S = R \times I_{PD1} \quad (1)$$

The reference voltage generator 9 also has a configuration similar to that of the signal voltage generator 5 and converts the photocurrent $I_{PD2}$ into the reference voltage $V_{REF1}$ which is expressed by the following formula (2).

$$V_{REF1} = R \times I_{PD2} \quad (2)$$

The receiving circuit 100 according to the present embodiment is set in such a way that the peak value of the signal voltage $V_S$ becomes larger than the peak value of the reference voltage $V_{REF1}$. For example, the photocurrent $I_{PD2}$ is made smaller than photocurrent $I_{PD1}$ by setting the light receiving sensitivity of the photodiode 7 lower than the light receiving sensitivity of the photodiode 3.

In order to produce the photodiodes 3, 7, two photodiodes of the same structure are formed on the same semiconductor substrate, for example. A portion of a receiving surface of one of the photodiodes is shielded to lower the light receiving sensitivity of the one of the photodiodes to use it as the photodiode 7. The other of the photodiodes is used as the photodiode 3. The signal voltage $V_S$ and the threshold voltage $V_{TH}$ based on the reference voltage $V_{REF1}$ are compared by the comparator 13, and, the comparison compensates an offset which is caused by a dark current of the photodiode 3, and compensates a shift of the signal voltage $V_S$ which is caused by a bias due to circuitry variation even when any signal is not input to the photodiode 3.

The gain of the trans-impedance amplifier 25 of the reference voltage generator 9 may suitably be adjusted so that the reference voltage $V_{REF1}$ can not exceed the signal voltage $V_S$.

In the receiving circuit 100 according to the present embodiment, the threshold voltage $V_{TH}$ of the comparator 13 follows the light signal and changes. Accordingly, erroneous operation due to fluctuation of the light signal can be suppressed.

FIGS. 7A to 7C are time charts showing an operation of a receiving circuit according to a comparative example. FIG. 7A shows a relationship between the signal voltage $V_S$ and the threshold voltage $V_{TH}$ when the intensity of the light signal is large. FIG. 7B shows a relationship between the signal voltage $V_S$ and the threshold voltage $V_{TH}$ when the intensity of a light signal is small. FIG. 7C shows an output voltage $V_{OUT}$ of a comparator of the comparative example. $V_B$ shows a bias level of a case where any signal is not input into a photodiode of a comparative example.

In the receiving circuit according to the comparative example, a fixed threshold voltage $V_{TH}$ is given as an input of the comparator for comparison. Thus, when the intensity of a light signal is large, as shown in FIG. 7A, the level of the threshold voltage $V_{TH}$ becomes lower than that of the signal voltage $V_S$. On the other hand, when the intensity of a light signal is small, as shown in FIG. 7B, the level of the threshold voltage $V_{TH}$ becomes higher than that of the signal voltage. $V_S$.

The Points indicated by "A" and "B" in FIGS. 7A, 7B respectively are cross points of the signal voltage $V_S$ and the threshold voltage $V_{TH}$ when the signal voltage $V_S$ rises, and the output of the comparator is switched at the timings of the cross points.

A photodiode which converts a light signal into a photocurrent may cause a tailing phenomenon. In the tailing phenomenon, charges generated inside remain even after light disappears, and a falling portion of an output signal waveform is stretched. Thus, a time difference arises between the cross points A, B of FIGS. 7A, 7B depending on the intensity of the light signal. As a result, as shown in FIG. 7C, the pulse width of the output signal $V_{OUT}$ of the comparator changes.

Such a change of the pulse width may an erroneous operation when the frequency of the light signal is high so that the pulse interval of the output signal $V_{OUT}$ is small. In a case where a high-frequency light signal of several tens to 100 MHz, for example, is received, switching of the comparator is delayed due to tailing of the signal voltage $V_S$, when the intensity of the light signal is large and the threshold voltage $V_{TH}$ is relatively low. As a result, a next light pulse is received before the signal voltage $V_S$ falls to the level of the cross points, which may cause an erroneous operation in which the output of the comparator is not switched.

Further, the waveform of the signal voltage $V_S$ may be blunted due to degradation of frequency characteristics due to a parasitic capacitance of the receiving circuit. In such a case, an erroneous operation may also be caused by fluctuation of the timing of the switching depending on the intensity of the light signal when the waveform falls.

In the receiving circuit 100 according to the present embodiment, the threshold voltage $V_{TH}$ changes following an intensity of a light signal, and thus, the erroneous operation as described above can be suppressed.

Figure 2A:
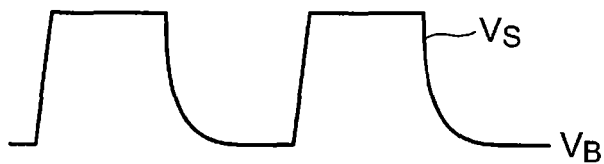
FIGS. 2A to 2E are time charts showing an operation of the receiving circuit according to the first embodiment.
Figure 2B:
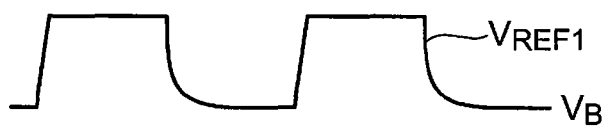
Figure 2C:
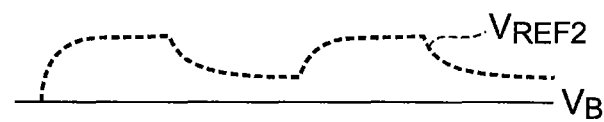
Figure 2D:
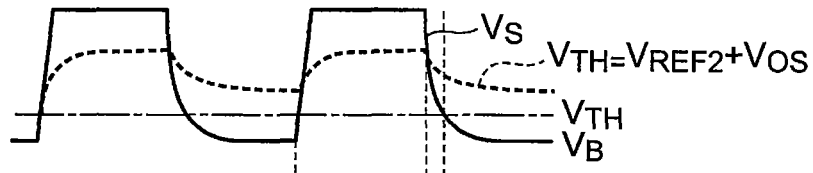
Figure 2E:
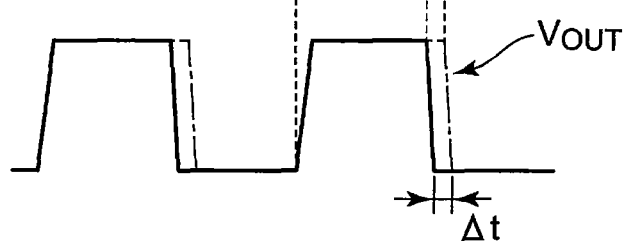

An operation of the receiving circuit 100 will be described with reference to FIGS. 2A to 2E. FIG. 2A is a time chart showing the signal voltage $V_S$. FIG. 2B shows the reference voltage $V_{REF1}$. FIG. 2C shows the reference voltage $V_{REF2}$ which is output from the delay circuit 15. FIG. 2D shows the signal voltage $V_S$ and the threshold voltage $V_{TH}$. FIG. 2E shows the output voltage $V_{OUT}$. In FIGS. 2A to 2D, $V_B$ shows a bias level arises when any signal is not input into the photodiode 7.

As shown in FIGS. 2A and 2B, the peak value of the signal voltage $V_S$ output from the signal voltage generator 5 is larger than the peak value of the reference voltage $V_{REF1}$ output from the reference voltage generator 9. For example, the reference voltage generator 9 can be caused to output the reference voltage $V_{REF1}$ which is lower than the signal voltage $V_S$ by shielding 50% of the area of the receiving surface of the photodiode 7.

The signal voltage $V_S$ and the reference voltage $V_{REF1}$ are output while keeping a fixed ratio between the voltages, and the reference voltage $V_{REF1}$ follows a fluctuation of the signal voltage $V_S$. The signal voltage $V_S$ and the reference voltage $V_{REF1}$ are output as voltage pulses in proportion to the photocurrents $I_{PD1}$ and $I_{PD2}$. In a case where the photodiodes 3, 7 are formed on a silicon substrate, for example, the signal voltage $V_S$ and the reference voltage $V_{REF1}$ have pulse waveforms with tailing caused at falling portions of the voltages, respectively.

In a photodiode using silicon as a constituent material, a signal light reaches a neutral region of the substrate and excited carriers are output as a diffusion current because the optical absorption coefficient of silicon is small. The diffusion current is output with delay subsequently to a drift current caused by carriers which are excited in a biased region. Accordingly, tailing is caused at a falling portion of a photocurrent. Such tailing of a pulse waveform is an unavoidable problem for a receiving circuit provided on a silicon substrate, and it is necessary to suppress the influences of tailing.

The reference voltage $V_{REF1}$ output from the reference voltage generator 9 is input into the delay circuit 15 and output, as shown in FIG. 2C, as the reference voltage $V_{REF2}$ which is obtained by reducing a signal component of the reference voltage $V_{REF1}$. For example, a high-frequency component of the reference voltage $V_{REF1}$ is removed using a low-pass filter as the delay circuit 15, and the reference voltage $V_{REF2}$ which is obtained by smoothing and delaying the reference voltage $V_{REF1}$ is output from the delay circuit 15.

Further, the offset voltage $V_{OS}$ is added to the reference voltage $V_{REF2}$ which is output from the delay circuit 15, and a voltage obtained by the adding is input into the comparator 13 as the threshold voltage $V_{TH}$.

The reference voltage $V_{REF2}$ is output in proportion to the signal voltage $V_S$, and further the level of the threshold voltage $V_{TH}$ is adjusted by the offset voltage $V_{OS}$. Accordingly, for example, as shown in FIG. 2D, the cross point of the signal voltage $V_S$ and the threshold voltage $V_{TH}$ can be maintained at an intermediate level between the peak of the signal voltage $V_S$ and the bias level $V_B$ which is given when any signal is not input in to the photodiode 7. Accordingly, the influences of tailing which is caused when the signal voltage $V_S$ falls can be reduced.

On the other hand, regarding the fixed threshold voltage $V_{TH}$ which is shown for comparison, as shown in FIG. 2D, the level of the threshold voltage $V_{TH}$ becomes relatively low when the peak level of the signal voltage $V_S$ is high. Thus, the cross point of the voltages $V_S$ and $V_{TH}$ falls, the influences of tailing of the pulse waveforms arise. As a result, as shown in FIG. 2E, switching of the comparator 13 is delayed, which causes a transmission delay time Δt of the output voltage $V_{OUT}$. The transmission delay time Δt fluctuates depending on the level of the light signal so that erroneous operation is caused when a high-frequency light signal is received.

Accordingly, the receiving circuit 100 according to the present embodiment changes the output $V_{REF1}$ of the reference voltage generator 9 following the signal voltage $V_S$, and further generates the reference voltage $V_{REF2}$ obtained by delaying and reducing a signal component by the delay circuit 15. As a result, the threshold voltage $V_{TH}$ can be maintained at an intermediate level of the height of the signal voltage $V_S$, for example. It becomes possible to suppress fluctuation of the transmission delay time Δt due to tailing of the signal voltage $V_S$ so that erroneous operation can be suppressed when a high-frequency signal is received.

The low-pass filter is recited as the delay circuit 15 in the above embodiment, but the delay circuit 15 is not limited to the low-pass filter. For example, the delay circuit 15 may be a circuit which delays a signal component simply without transforming the waveform of the reference voltage $V_{REF1}$.

Figures 3A, 3B:
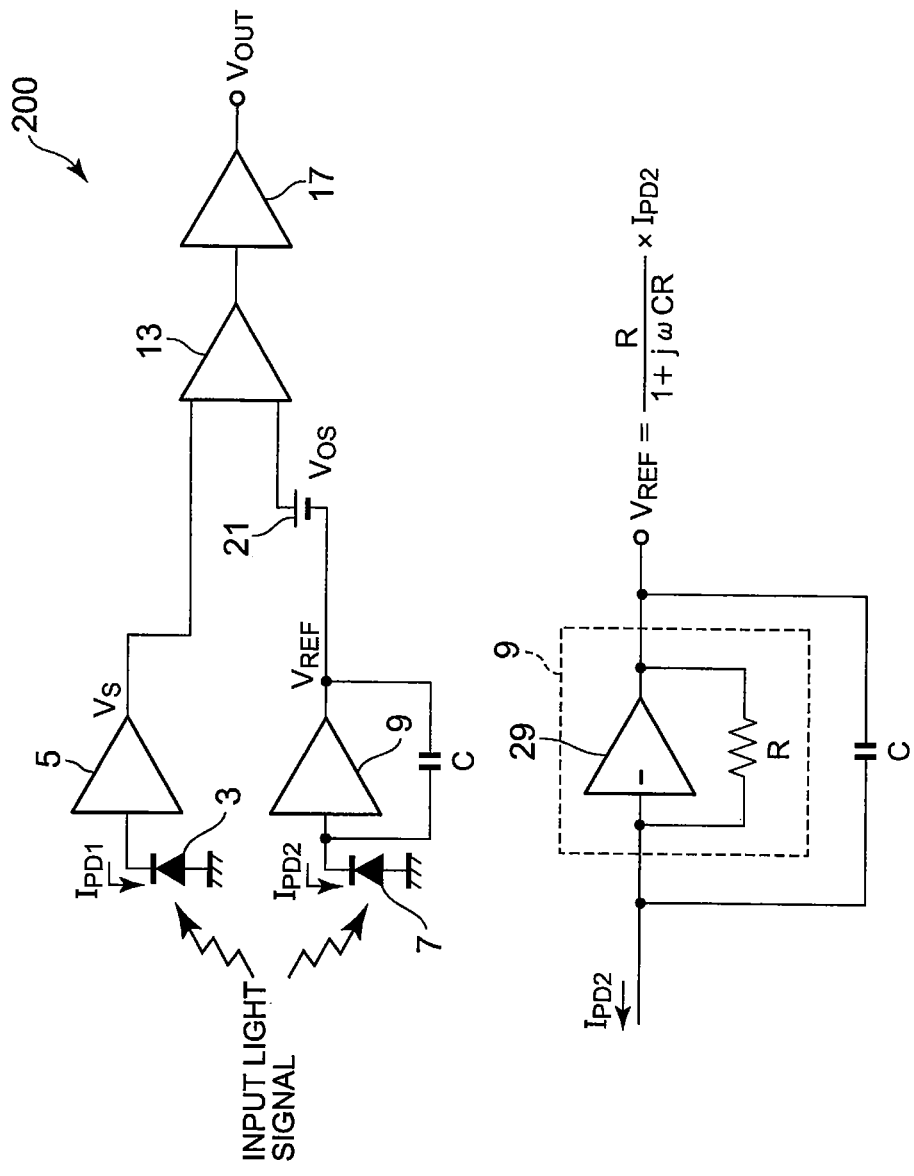
FIG. 3A is a circuit diagram showing a receiving circuit according to a second embodiment.
FIG. 3B is a circuit diagram showing a reference voltage generator.

FIG. 3A is a circuit diagram showing a receiving circuit according to a second embodiment. FIG. 3B is a circuit diagram showing a reference voltage generator which is used in the receiving circuit.

In a receiving circuit 200, as shown in FIG. 3A, a feedback capacitor C is provided in a reference voltage generator 9 as a delay element which delays and reduces a signal component of a reference voltage $V_{REF}$. The feedback capacitor C is added in place of the delay circuit 15 shown in FIG. 1A.

As shown in FIG. 3B, the reference voltage generator 9 contains an inverter amplifier 29 and a feedback resistor R, for example. The feedback capacitor C is connected to an input terminal and an output terminal of the inverter amplifier 29 in parallel with the feedback resistor R. The reference voltage $V_{REF}$ which is output from the reference voltage generator 9 of FIG. 3B is expressed by the following formula (3). "R" is a resistance of the feedback resistor R. "C" is a capacitance of the feedback capacitor C. "ω" is a frequency of a light signal.

$$V_{REF}=R/(1+j\omega CR)\times I_{PD2} \qquad (3)$$

The reference voltage $V_{REF}$ shown in the above formula (3) is attenuated in a high frequency region and indicates a voltage waveform similar to that obtained via a low-pass filter, for example. The capacitance value of the feedback capacitor C is set to a value such that a delay caused when the pulse waveform of FIG. 2C falls is suitable.

Thus, by adding the feedback capacitor C to the reference voltage generator 9, the reference voltage generator 9 can output a reference voltage $V_{REF}$ similar to the reference voltage $V_{REF2}$ of the receiving circuit 100 where a low-pass filter is added as a delay element. Further, the receiving circuit 200 according to the present embodiment has a simpler circuit configuration than the receiving circuit 100 of the first embodiment.

Figure 4:
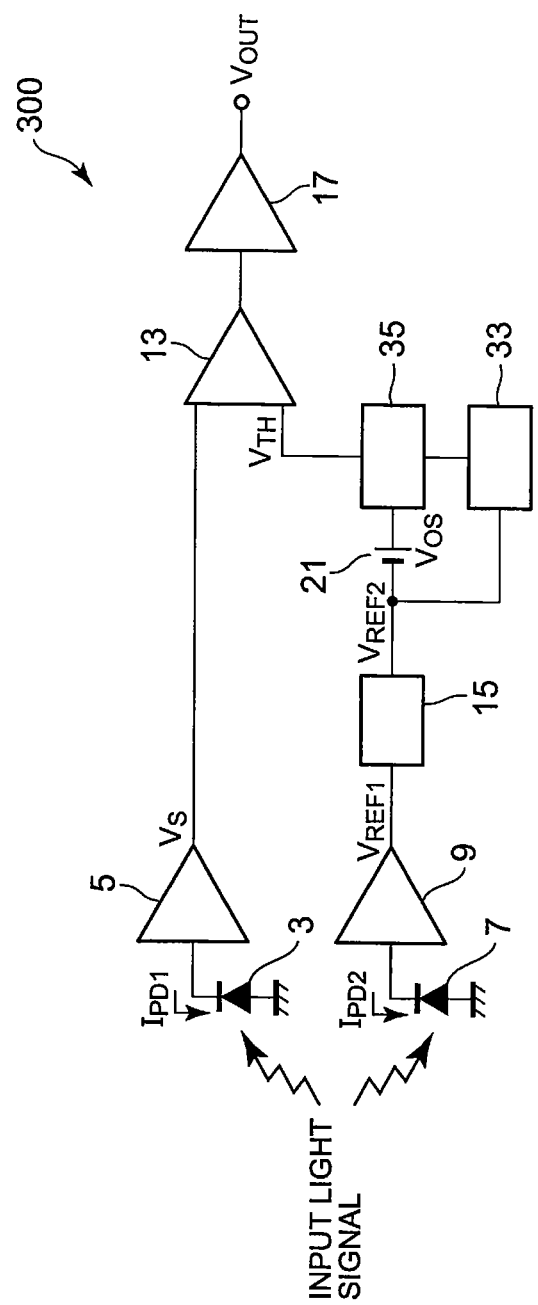
FIG. 4 is a circuit diagram showing a receiving circuit according to a third embodiment.

FIG. 4 is a circuit diagram showing a receiving circuit according to a third embodiment. As shown in FIG. 4, a receiving circuit 300 includes a level detector 33 which detects a peak level of a reference voltage $V_{REF2}$. Further, the receiving circuit 300 is provided with a level shift unit 35 which shifts a level of a threshold voltage $V_{TH}$ based on a peak level detected by the level detector 33.

A reference voltage generator 9 receives a signal from a photodiode 7 and provides a reference voltage $V_{REF1}$ to a delay circuit 15. The delay circuit 15 provided a reference voltage $V_{REF2}$ to the level detector 33 and a constant voltage circuit 21. The constant voltage circuit 21 provides a signal to the level shift unit 35. A reference voltage generator 5 receives a signal from a photodiode 3. The reference voltage generator 5 and the level shift unit 35 provide a signal voltage $V_S$ and a threshold voltage $V_{TH}$ to a comparator 13 to output an output voltage $V_{OUT}$.

In the receiving circuits 100 and 200 according to the first and second embodiments, the reference voltage $V_{REF2}$ is smoothed by the delay circuit 15 so that an intermediate level of the height of a signal voltage $V_S$ can be maintained. As a result, the receiving circuits work effectively when the pulse frequency of a light signal is large, and erroneous operation can be suppressed. However, when the pulse frequency becomes smaller and, correspondingly, the pulse interval becomes larger, erroneous operation may be caused by influence of noise. The receiving circuit 300 according to the present embodiment can receive both light signals of high and low frequencies while suppressing erroneous operation.

Figure 5A:
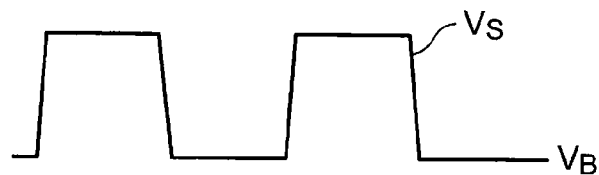
FIGS. 5A to 5E are time charts showing an operation of the receiving circuit according to the third embodiment.
Figure 5B:
Figure 5C:
Figure 5D:
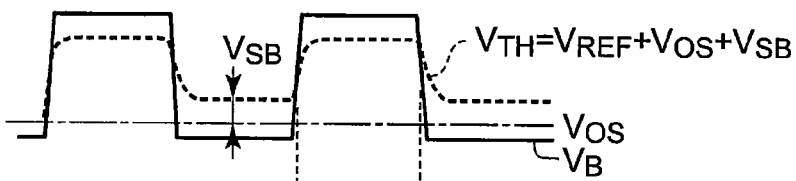
Figure 5E:
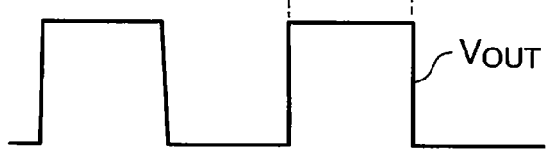

FIGS. 5A to 5E are time charts showing an operation of the receiving circuit 300. FIG. 5A shows the signal voltage $V_S$. FIG. 5B shows the reference voltage $V_{REF1}$. FIG. 5C shows the reference voltage $V_{REF2}$ which is output from the delay circuit 15. FIG. 5D shows the signal voltage $V_S$ and the threshold voltage $V_{TH}$. FIG. 5E shows the output voltage $V_{OUT}$.

FIGS. 5A to 5E are time charts when a pulse frequency of a light signal is low, for example, the pulse frequency is a several kHz. The time scale of the horizontal axis in the time charts of FIGS. 5A to 5E is compressed compared with FIGS. 2A to 2E. Accordingly, pulse waveforms of the signal voltage $V_S$ and the reference voltage $V_{REF1}$ of FIGS. 5A and 5B can be shown in a shape close to square waves obtained by compressing tailings of falling portions of the waveforms.

Further, as shown in FIG. 5C, when the pulse interval of the reference voltage $V_{REF2}$ is larger than a delay time added by the delay circuit 15, the reference voltage $V_{REF2}$ returns to a bias level $V_B$ which is given without any light signal, before the next pulse rises. The threshold voltage $V_{TH}$ obtained when the pulse waveforms rise become the same level as an offset voltage $V_{OS}$ substantially, and, as a result, the receiving circuit is more likely to be affected by noise.

The receiving circuit 300 according to the present embodiment detects the peak level of the reference voltage $V_{REF2}$ by the level detector 33. When the peak level of the reference voltage $V_{REF2}$ falls below a predetermined level, for example, a constant shift voltage $V_{SB}$ is added by the level shift unit 35. The threshold voltage $V_{TH}$ is shifted to the level shown by the following formula (4).

$$V_{TH}=V_{REF2}+V_{OS}+V_{SB} \qquad (4)$$

FIG. 5D shows the signal voltage $V_S$ and the level-shifted threshold voltage $V_{TH}$. By suitably setting the shift voltage $V_{SB}$, the level of the threshold voltage $V_{TH}$ can be maintained at an intermediate level of the height of the signal voltage $V_S$, which makes the receiving circuit less likely to be affected by noise.

Thus, the receiving circuit 300 according to the present embodiment can receive a light signal of a frequency ranging widely from a several kHz to 100 MHz, for example, while suppressing erroneous operation.

In a detecting circuit which detects a peak level of the signal voltage $V_S$ and simply shifts the threshold voltage $V_{TH}$, for example, the threshold voltage $V_{TH}$ fluctuates between an initial pulse and the subsequent pulse when a signal frequency is high, which may cause fluctuating delay time. This is because the detected voltage is not a true peak value and varies when the time constant of the detecting circuit for detecting the peak level is made smaller to receive a high-frequency signal.

In the receiving circuit 300, the threshold voltage $V_{TH}$ rises due to an effect of the delay circuit 15 when a high-frequency signal is received. Thus, the level shift is not performed, and the delay time does not fluctuate.

A large current may instantaneously flow to a photodiode by peaking of a light signal due to a parasitic capacitance of a light emitting device (LED) on a light transmitting side. Further, peaking may intentionally be caused by adding a capacitor on the transmitting side to shorten a delay time. In such a case, when a peak of a signal voltage $V_S$ is detected, a peak voltage higher than the intrinsic peak may be detected, which causes an erroneous operation due to fluctuation of the delay time on a receiving side. In the receiving circuit 300, erroneous operation can be suppressed because peaking can be smoothed by the delay circuit 15 containing a low-pass filter, for example.

Figure 6:
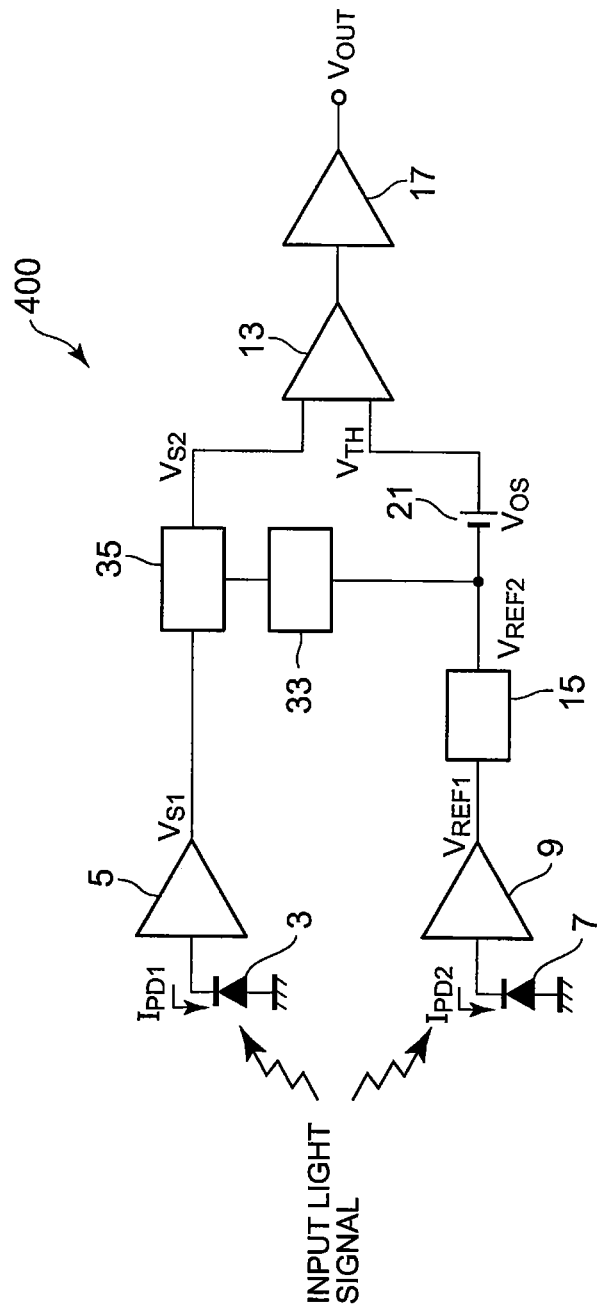
FIG. 6 is a circuit diagram showing a receiving circuit according to a modification of the third embodiment.

FIG. 6 is a circuit diagram showing a receiving circuit 400 according to a modification of the third embodiment. Both of the receiving circuits 300, 400 have a configuration that a level detector 33 which detects a peak level of a reference voltage $V_{REF2}$ is provided, commonly. The receiving circuit 400 is different from the receiving circuit 300 in that a level shift unit 35 shifts the level of a signal voltage $V_{S1}$ of a signal voltage generator 5 to a voltage $V_{S2}$ based on the peak level detected by the level detector 33. A comparator 13 compares a signal voltage $V_{S2}$ and a threshold voltage $V_{TH}$ and outputs an output signal $V_{OUT}$.

The receiving circuit 400 according to the present embodiment can receive a light signal of a frequency of a wide range, while suppressing erroneous operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A receiving circuit, comprising:
   a first light receiving element which receives a light signal and converts the light signal into a first current;
   a signal voltage generator which converts the first current into a signal voltage;
   a second light receiving element which receives the light signal and converts the light signal into a second current that is less than the first current;
   a reference voltage generator which converts the second current into a reference voltage having a level that is lower than a level of the signal voltage by a predetermined factor;
   a delay element which delays and reduces a signal component of the reference voltage; and
   a comparator which compares the signal voltage with a threshold voltage that is based on an output voltage of the delay element.

2. The receiving circuit according to claim 1, wherein the delay element is a low-pass filter provided between the reference voltage generator and the comparator.

3. The receiving circuit according to claim 1, further comprising:
   a level detector which detects a peak level of the output voltage of the delay element; and
   a level shift unit which shifts the threshold voltage based on the peak level detected by the level detector.

4. The receiving circuit according to claim 1, further comprising:
   a level detector which detects a peak level of the output voltage of the delay element; and
   a level shift unit which shifts the level of the signal voltage based on the peak level detected by the level detector.

5. A receiving circuit, comprising:
   a first light receiving element which receives a light signal and converts the light signal into a first current;
   a signal voltage generator which converts the first current into a signal voltage;
   a second light receiving element which receives the light signal and converts the light signal into a second current that is less than the first current;
   a reference voltage generator which includes a trans-impedance amplifier to convert the second current into a reference voltage having a level that is lower than a level of the signal voltage by a predetermined factor;
   a feedback capacitor which is connected with the trans-impedance amplifier, and which delays and reduces a signal component of the reference voltage; and
   a comparator which compares the signal voltage with a threshold voltage that is based on the reference voltage.

6. The receiving circuit according to claim 5, further comprising:
   a level detector which detects a peak level of an output voltage of the feedback capacitor; and
   a level shift unit which shifts the threshold voltage based on the peak level detected by the level detector.

7. The receiving circuit according to claim 5, further comprising:
   a level detector which detects a peak level of an output voltage of the feed back capacitor; and
   a level shift unit which shifts the level of the signal voltage based on the peak level detected by the level detector.

8. The receiving circuit according to claim 1, wherein the delay element is a feedback capacitor.

9. The receiving circuit according to claim 3, further comprising:
   a constant voltage circuit which is connected between the delay element and the level shift unit so as to add a constant voltage to the output voltage of the delay element.

10. The receiving circuit according to claim 6, further comprising:
   a constant voltage circuit which is connected between the feedback capacitor and the level shift unit so as to add a constant voltage to the output voltage of the feedback capacitor.

\* \* \* \* \*